(12) United States Patent
Lee et al.

(10) Patent No.: US 11,621,047 B2
(45) Date of Patent: Apr. 4, 2023

(54) APPARATUS FOR PERFORMING A REPAIR OPERATION

(71) Applicant: SK hynix Inc., Icheon-si (KR)

(72) Inventors: Jeong Jun Lee, Icheon-si (KR); Soo Hwan Kim, Icheon-si (KR); Mi Hyun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 31 days.

(21) Appl. No.: 17/390,371

(22) Filed: Jul. 30, 2021

(65) Prior Publication Data
US 2022/0301648 A1    Sep. 22, 2022

(30) Foreign Application Priority Data
Mar. 19, 2021   (KR) .......................... 10-2021-0036258

(51) Int. Cl.
| | |
|---|---|
| *G11C 29/02* | (2006.01) |
| *G11C 29/00* | (2006.01) |
| *G11C 29/18* | (2006.01) |
| *G11C 29/44* | (2006.01) |

(52) U.S. Cl.
CPC ............ *G11C 29/025* (2013.01); *G11C 29/18* (2013.01); *G11C 29/4401* (2013.01); *G11C 29/785* (2013.01)

(58) Field of Classification Search
CPC ... G11C 29/025; G11C 29/18; G11C 29/4401; G11C 29/785
See application file for complete search history.

(56) References Cited

U.S. PATENT DOCUMENTS

| | | | |
|---|---|---|---|
| 2009/0319839 A1* | 12/2009 | Surulivel ............. | G11C 29/808 714/E11.023 |
| 2019/0130993 A1* | 5/2019 | Kim ....................... | G11C 16/08 |

FOREIGN PATENT DOCUMENTS

| | | |
|---|---|---|
| KR | 1020120020822 A | 3/2012 |
| KR | 1020180124568 A | 11/2018 |

\* cited by examiner

*Primary Examiner* — Mohammed A Bashar
(74) *Attorney, Agent, or Firm* — William Park & Associates Ltd.

(57) ABSTRACT

An apparatus includes a potential failure information generation circuit configured to generate potential failure inforrnation by detecting, based on first failure information on a first faded signal line and second failure information on a second faded signal line, whether the first failed signal line and the second faded signal line are adjacent to each other; and a flag generation circuit configured to generate a flag by comparing the potential failure information with redundancy repair information.

20 Claims, 9 Drawing Sheets

APPARATUS FOR PERFORMING A REPAIR OPERATION

CROSS-REFERENCE TO RELATED APPLICATION

The present application claims priority under 35 U.S.C. § 119(a) to Korean application number 10-2021-0036258, filed in the Korean Intellectual Property Office on Mar. 19, 2021, the entire disclosure of which is incorporated herein by reference in its entirety.

BACKGROUND

1. Technical Field

Embodiments of the disclosure generally relate to an to apparatus, and more particularly, to an apparatus for performing a repair operation.

2. Related Art

A semiconductor device may perform a repair operation of replacing a faded memory cell with a normal memory cell. In a conventional semiconductor device, a (column) repair operation is performed as each of a plurality of memory regions includes a redundancy region, Unlike this, in a recent semiconductor device, a (column) repair operation may be efficiently performed through a full flexible column repair (FFCR) scheme in which a plurality of memory regions share a separately provided redundancy region.

Meanwhile, in a semiconductor device, failures may be concentrated in a specific region due to failures in a process. In this case, in order to ensure quality, a repair operation may be performed not only for the region in which failures are concentrated but also for a region adjacent to the region in which failures are concentrated.

SUMMARY

In an embodiment, an apparatus may include: a potential failure information generation circuit configured to generate potential failure information by detecting, based on first failure information on a first failed signal line and second failure information on a second failed signal line, whether the first failed signal line and the second failed signal line are adjacent to each other; and a flag generation circuit configured to generate a flag by comparing the potential failure information with redundancy repair information.

In an embodiment, an apparatus may include: a repair control circuit configured to generate, based on first failure information on a first failed signal line, redundancy repair information for repairing the first failed signal line in a redundancy region; and a flag generation circuit configured to generate a flag by comparing potential failure information on a failure-adjacent signal line with the redundancy repair information.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described through embodiments. The embodiments are only used to provide examples of the teachings of the present disclosure, and the scope of the present disclosure is not limited by the embodiments.

Various embodiments are directed to an apparatus for performing a repair operation.

According to the disclosure, by checking, in a repair mode, whether there is a repair line for a failure-adjacent signal line neighboring failed signal lines adjacent to each other, it may be possible to determine whether an additional repair operation is to be performed on the failure-adjacent signal line having a possibility for a failure to occur.

Figure 1:
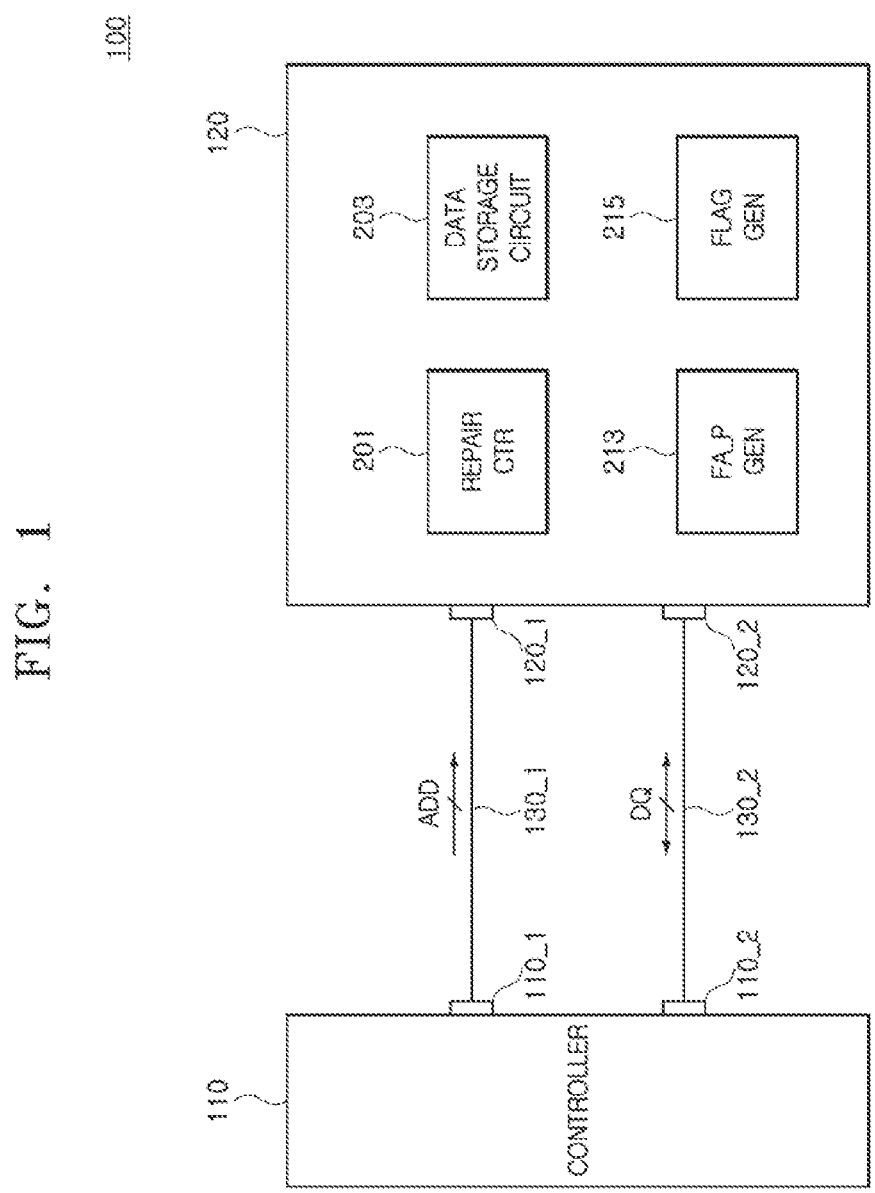
FIG. 1 is a block diagram illustrating a configuration of a system in accordance with an embodiment of the disclosure.

FIG. 1 is a block diagram illustrating a configuration of a system 100 in accordance with an embodiment of the disclosure, As illustrated in FIG. 1, the system 100 may include a controller (CONTROLLER) 110 and an apparatus 120. The apparatus 120 may be implemented by a semiconductor device.

The controller 110 may include a first control pin 110_1 and a second control pin 110_2. The apparatus 120 may include a first apparatus pin 120_1 and a second apparatus pin 120_2. The controller 110 may transmit an address ADD to the apparatus 120 through a first transmission line 130_1 which is coupled between the first control pin 110_1 and the first apparatus pin 120_1. The number of bits of the address ADD may be variously set depending on an embodiment. The controller 110 may transmit and receive data DQ to and from the apparatus 120 through a second transmission line 130_2 which is coupled between the second control pin 110_2 and the second apparatus pin 120_2. The number of bits of the data DQ may be variously set depending on an embodiment.

The apparatus 120 may include a repair control circuit (REPAIR CTR) 201, a data storage circuit (DATA STORAGE CIRCUIT) 203, a potential failure information generation circuit (FA_P GEN) 213 and a flag generation circuit (FLAG GEN) 215. The apparatus 120 may perform various internal operations including a test mode, a repair mode and a column operation, based on the address ADD and the data DQ. The column operation may include a write operation and a read operation.

Figure 2:
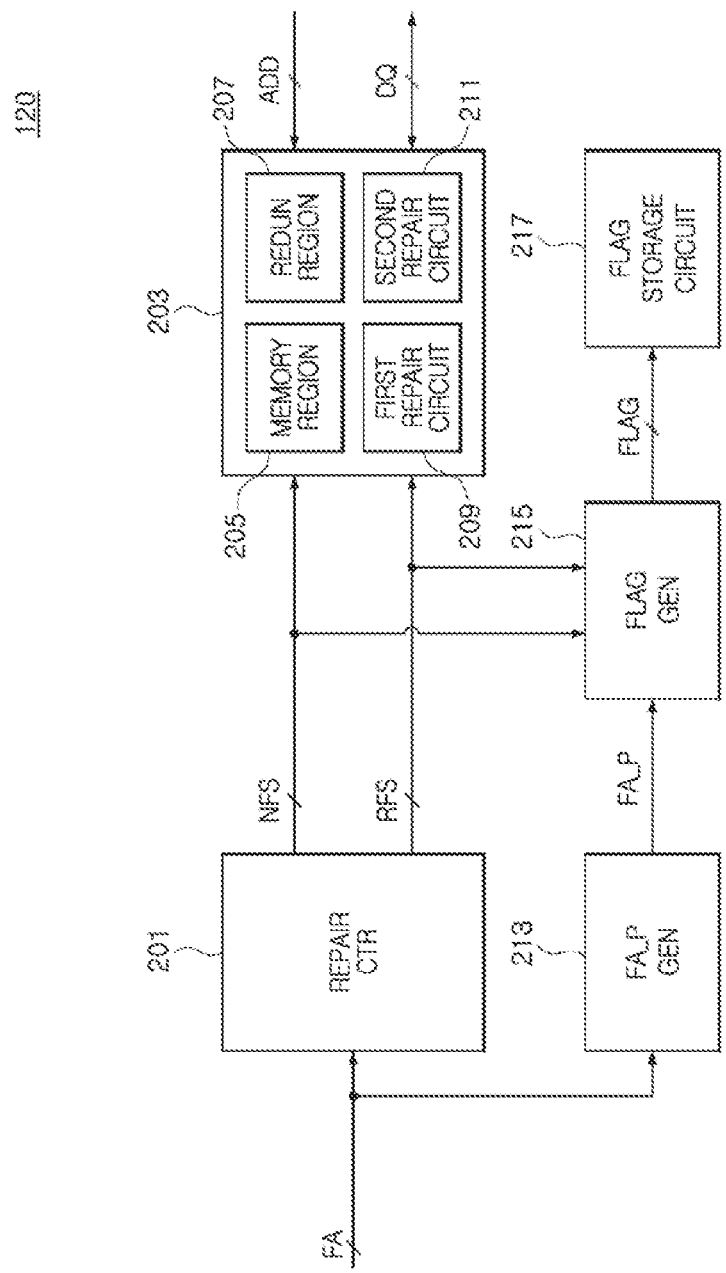
FIG. 2 is a block diagram illustrating a configuration of an embodiment of an apparatus illustrated in FIG. 1.

The data storage circuit 203 may include a memory region 205 (see FIG. 2) and a redundancy region 207 (see FIG. 2). The memory region 205 may include a plurality of memories MAT_L<1:M> and MAT_R<1:M> (see FIG. 3). The redundancy region 207 may include a redundancy memory RMAT_(see FIG. 3), Each of the plurality of memories MAT_L<1:M> and MAT_R<1:M> and the redundancy memory RMAT may include a plurality of signal lines C<1:N> (see FIG. 3), In an embodiment, 'M' and 'N' may be a natural numbers, Each of the plurality of memories MAT_L<1:M> and MAT_R<1:M> (see FIG. 3) may correspond to each combination of memory region information, For example, the first memory MAT_L<1> may correspond to a first combination of the memory region information. The second memory NlAT_L<2> may correspond to a second combination of the memory region information, Memory region information on a signal line may be set as information on a memory in which the corresponding signal line is included in the memory region 205 (see FIG. 2). For example, memory region information on the first signal line C<1> included in the first memory MAT_L<1> may be set as information on the first memory MAT_L<1>, The plurality of signal lines C<1:N> (see FIG. 3) may correspond to address information set by respective combinations of the address ADD. For example, the first signal lines C<1> included in the plurality of memories MAT_L.<1:M> and MAT_R<1:M> (see FIG. 3) and the redundancy memory RMAT_(see FIG. 3) may correspond to address information set by a first combination of the address ADD. The second signal lines C<2> included in the plurality of memories MAT_L<1:M> and MAT_R<1:M> (see FIG. 3) and the redundancy memory RMAT_may correspond to address information set by a second combination of the address ADD.

The repair control circuit 201 may receive failure information FA (internal circuit that generates failure information in the test mode not shown) on a failed signal line in the test mode. The failed signal line may be set as a signal line in which, in the test mode, a failure is detected among the plurality of signal lines C<1:N> (see FIG. 3) included in the memory region 205 (see FIG. 2). The failure information FA may include memory region information and address information on the faded signal line.

The repair control circuit 201 may generate redundancy repair information RFS (see FIG. 2) and normal repair information NFS (see FIG. 2) based on the failure information FA (see FIG. 2) in the repair mode. The redundancy repair information RFS may be generated to repair a faded signal line with a redundancy repair line included in the redundancy region 207 (see FIG. 2). The redundancy repair line may be set as one of the plurality of signal lines C<1:M> (see FIG. 3) included in the redundancy region 207. The normal repair information NFS may be generated to repair a failed signal line with a normal repair line included in the memory region 205 (see FIG. 2). The normal repair line may be set as one of the plurality of signal lines C<1:N> (see FIG. 3) included in the memory region 205.

The potential failure information generation circuit 213 may generate potential failure information FA_P (see FIG. 2) on a failure-adjacent signal line when failed signal lines are adjacent to each other based on the failure information FA (see FIG. 2). The failure-adjacent signal line may be set as one of signal lines neighboring failed signal lines adjacent to each other in one memory, Also, the failure-adjacent signal line may be set as a signal line in which, in the test mode, no failure is detected among the plurality of signal lines C<1:N> (see FIG. 3) included in the memory region 205 (see FIG. 2), For example, when the first and second signal lines C<1> and C<2> (see FIG. 3) of the first memory MAT_L<1> (see FIG. 3) are failed signal lines, the third signal line C<3> (see FIG. 3) of the first memory MAT_L<1> (see FIG. 3) may be set as a failure-adjacent signal line in which, in the test mode, no failure is detected.

When a repair operation is performed, the flag generation circuit 215 may generate a flag FLAG (see FIG. 2) by comparing the potential failure information FA_P (see FIG. 2) on a failure-adjacent signal line and the redundancy repair information RFS (see FIG. 2) for repairing a faded signal line in the redundancy region 207 (see FIG. 2). Also, when the repair operation is performed, the flag generation circuit 215 may generate the flag FLAG (see FIG. 2) by comparing the potential failure information FA_P (see FIG. 2) on a failure-adjacent signal line and the normal repair information NFS (see FIG. 2) for repairing a faded signal line in the memory region 205 (see FIG. 2).

Accordingly, by checking, in the repair mode, whether there is a repair line for a failure-adjacent signal line neighboring faded signal lines adjacent to each other, the apparatus 120 may generate the flag FLAG (see FIG. 2) to indicate whether an additional repair operation is to be performed on the failure-adjacent signal line having possibility for a failure to occur.

FIG. 2 is a block diagram illustrating an embodiment of the apparatus 120 illustrated in FIG. 1. As illustrated in FIG. 2, the apparatus 120 may include the repair control circuit (REPAIR CTR) 201, the data storage circuit 203, the potential failure information generation circuit (FA_P GEN) 213, the flag generation circuit (FLAG GEN) 215 and a flag storage circuit (FLAG STORAGE CIRCUIT) 217.

In the repair mode, the repair control circuit 201 may generate the redundancy repair information RFS and the normal repair information NFS based on the failure information FA. Each failure information FA may include memory region information and address information on one of failed signal lines. For example, first failure information FA<1> may include memory region information and address information on a first failed signal line. Second failure information FA<2> may include memory region information and address information on a second failed signal line.

The repair control circuit 201 may generate the redundancy repair information RFS to repair a failed signal line with a redundancy repair line, included in the redundancy region 207, based on the failure information FA. The redundancy repair information RFS may include memory region information and address information on a failed signal line of the failure information FA. Address information on the redundancy repair line may be set to be the same as the address information on the failed signal line. The repair control circuit 201 may output the redundancy repair information RFS by arranging memory region information of the failure information FA for respective combinations of address information of the failure information FA. For example, when address information on a first failed signal line corresponds to the first signal line C<1> (see FIG. 3), the repair control circuit 201 may output memory region information on the first faded signal line as first redundancy repair information RFS<1> to a first redundancy fuse circuit REDUN<1> (see FIG. 3). When address information on a second faded signal line corresponds to the second signal line C<2> (see FIG. 3), the repair control circuit 201 may output memory region information on the second faded signal line as second redundancy repair information RFS<2> to a second redundancy fuse circuit REDUN<2> (see FIG. 3).

The repair control circuit 201 may generate the normal repair information NFS to repair a failed signal line with a normal repair line, included in the memory region 205, based on the failure information FA. The normal repair information NFS may include memory region information and address information on the failed signal line of the failure information FA. Also, the norm& repair information NFS may include memory region information and address information on the normal repair line. The repair control circuit 201 may output the normal repair information NFS by arranging address information of the failure information FA for respective combinations of memory region information of the failure information FA. Also, the repair control circuit 201 may output the normal repair information NFS by arranging address information on the normal repair line together with the address information of the failure information FA for respective combinations of memory region information of the failure information FA. Memory region information on the normal repair line may be set to be the same as the memory region information on the faded signal line. The address information on the normal repair line may be set to be different from the address information on the faded signal line, according to a preset algorithm. For example, when memory region information on a first faded signal line corresponds to the first memory MAT_L<1> (see FIG. 3), the repair control circuit 201 may output address information on the first failed signal line as first normal repair information NFS<1> to a first normal fuse circuit NORMAL_L<1> (see FIG. 3). Also, the repair control circuit 201 may output address information on a first normal repair line together with the address information on the first failed signal line as the first normal repair information NFS<1> to the first normal fuse circuit NORMAL_L<1>. Memory region information on the first normal repair line may be set to be the same as the memory region information on the first failed signal line. When the repair control circuit 201 receives second failure information FA<2> on a second failed signal line and memory region information on the second failed signal line corresponds to the second memory MAT_L<2> (see FIG. 3), the repair control circuit 201 may output address information on the second failed signal line as second normal repair information NFS<2> to a second normal fuse circuit NORMAL (see FIG. 3). Also, the repair control circuit 201 may output address information on a second normal repair line together with the address information on the second failed signal line as the second normal repair information NFS<2> to the second normal fuse circuit NORMAL_L<2>. Memory region information on the second normal repair line may be set to be the same as the memory region information on the second faded signal line.

When the pieces of failure information FA on failed signal lines having the same address information are input, the repair control circuit 201 may generate, with a higher priority, the redundancy repair information RFS and generate, with a lower priority, the normal repair information NFS, according to the preset algorithm. When generating, with a lower priority, the normal repair information NFS, the repair control circuit 201 may generate the redundancy repair information RFS for repairing a normal repair line with a redundancy repair line, according to the preset algorithm. For example, when first failure information FA<1> on a first failed signal line is input, the repair control circuit 201 may generate, with a higher priority, the redundancy repair information RFS for repairing the first failed signal line with a redundancy repair line. Thereafter, when second failure information FA<2> on a second failed signal line is input and address information on the second failed signal line is the same as address information on the first failed signal line, the repair control circuit 201 may generate, with a lower priority, the normal repair information NFS for repairing the second faded signal line with a normal repair line. When the second failure information FA<2> on the second failed signal line is input and the address information on the second faded signal line is the same as the address information on the first faded signal line, the repair control circuit 201 may generate the redundancy repair information RFS for repairing the normal repair line with a redundancy repair line. Unlike this, when the second failure information FA<2> on the second failed signal line is input and address information on the first failed signal line is different from address information on the second failed signal line, the repair control circuit 201 may generate the redundancy repair information RFS for repairing the second failed signal line with a redundancy repair line. Depending on an embodiment, the preset algorithm of the repair control circuit 201 may be set variously. The word "preset" as used herein with respect to a parameter, such as a preset algorithm, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm, The data storage circuit 203 may include the memory region (MEMORY REGION) 205, the redundancy region (REDUN REGION) 207, a first repair circuit (FIRST REPAIR CIRCUIT) 209 and a second repair circuit (SECOND REPAIR CIRCUIT) 211. When performing the column operation, the data storage circuit 203 may receive the address ADD and may input and output the data DQ to and from the memory region 205 and the redundancy region 207. In the present embodiment, the data storage circuit 203 may perform a (column) repair operation in a full flexible column repair (FFCR) scheme in which the memory region 205 shares the redundancy region 207. The full flexible column repair (FFCR) scheme may be defined as a scheme in which the redundancy memory R_MAT_(see FIG. 3) provides each the redundancy repair line to one of the plurality of memories MAT_L<1:M> and MAT_R<1:M> (see FIG. 3), depending on the preset algorithm in the repair control circuit 201.

The first repair circuit 209 may receive the redundancy repair information RFS in the repair mode and store the redundancy repair information RFS in redundancy fuse circuits REDUN<1:N > (see FIG. 3) for respective combinations of address information. When the address ADD on a failed signal line is input in the column operation, the first repair circuit 209 may repair the failed signal line with a redundancy repair line included in the redundancy region 207, based on the redundancy repair information RFS.

The second repair circuit 211 may receive the normal repair information MFS in the repair mode and store the normal repair information NFS in normal fuse circuits NORMAL<1:2M> (see FIG. 3) for respective combinations of memory region information. When the address ADD on a failed signal line is input in the column operation, the second repair circuit 211 may repair the failed signal line with a normal repair line included in the memory region 205, based on the normal repair information NFS, For example, when, in the column operation, a combination of the address ADD is the same as address information on the failed signal line based on the normal repair information NFS, the second repair circuit 211 may repair the to failed signal line by converting the combination of the address ADD into address information on a normal repair line. The detailed configuration and operation of the data storage circuit 203 will be described later with reference to FIG. 3.

In the repair mode, the potential failure information generation circuit 213 may generate the potential failure information FA_P on a failure-adjacent signal line, by detecting whether failed signal lines are adjacent to each other, based on a plurality of failure information FA. The potential failure information FA_P may include memory region information and address information on the failure-adjacent signal line. For example, the potential failure information generation circuit 213 may generate the potential failure information FA_P on a failure-adjacent signal line, by detecting whether a first failed signal line and a second failed signal line are adjacent to each other, based on first failure information FA<1> and second failure information FA<2>. For example, when memory region information on the first failed signal line and memory region information on the second failed signal line are the same as each other and address information on the first failed signal line and address information on the second failed signal line have successive combinations, the potential failure information generation circuit 213 may generate the potential failure information FA_P. Memory region information on the failure-adjacent signal line may be the same as the memory region information on the first and second failed signal lines. Address information on the failure-adjacent signal line may have a combination successive to the address information on the first and second failed signal lines. Successive combinations of address information may be set as combinations of the address ADD for accessing respective signal lines, located at adjacent locations in one memory. The detailed configuration and operation of the potential failure information generation circuit 213 will be described later with reference to FIG. 4.

The flag generation circuit 215 may generate the flag FLAG by comparing the potential failure information FA_P with the redundancy repair information RFS and the normal repair information NFS. The flag FLAG may be deactivated to indicate that there is a repair line for a failure-adjacent signal line. The flag FLAG may be activated to indicate that there is no repair line for repair a failure-adjacent signal line.

The flag generation circuit 215 may generate the flag FLAG by comparing the potential failure information FA_P on a failure-adjacent signal line with the redundancy repair information RFS. The flag generation circuit 215 may activate the flag FLAG when, based on the potential failure information FA_P and the redundancy repair information RFS, memory region information on the failure-adjacent signal line and memory region information on a failed signal line are different from each other and address information on the failure-adjacent signal line and address information on the failed signal line are the same as each other. For example, when the failure-adjacent signal line is set as the third signal line C<3> (see FIG. 3) of the first memory MAT_L<1> (see FIG. 3) and the failed signal line of the redundancy repair information RFS is set as the third signal line C<3> (see FIG. 3) of the second memory MAT_L<2> (see FIG. 3), the flag generation circuit 215 may activate the flag FLAG.

The flag generation circuit 215 may generate the flag FLAG by comparing the potential failure information FA_P on a failure-adjacent signal line with the normal repair information NFS. The flag generation circuit 215 may activate the flag FLAG when, based on the potential failure information FA_P and the normal repair information NFS, memory region information on the failure-adjacent signal line and memory region information on a normal repair line are different from each other and address information on the failure-adjacent signal line and address information on the normal repair line are the same as each other. For example, when the failure-adjacent signal line is set as the third signal line C<3> (see FIG. 3) of the first memory MAT_L<1> (see FIG. 3) and the normal repair line of the normal repair information NFS is set as the third signal line C<3> (see FIG. 3) of the third memory MAT_L<3> (see FIG. 3), the flag generation circuit 215 may activate the flag FLAG.

Accordingly, by checking, in the repair mode, whether there is a repair line for a failure-adjacent signal line neighboring failed signal lines adjacent to each other, the flag generation circuit 215 may generate the flag FLAG to indicate whether an additional repair operation is to be performed on the failure-adjacent signal line having possibility for a failure to occur. The detailed configuration and operation of the flag generation circuit 215 will be described later with reference to FIG. 5.

The flag storage circuit 217 may receive and store the flag FLAG. The flag storage circuit 217 may output the flag FLAG stored therein, based on a command (not illustrated) for transmitting the flag FLAG to the controller 110 (see FIG. 1). The flag storage circuit 217 may store the flag FLAG by electrically programming an e-fuse. The flag storage circuit 217 may store the flag FLAG for each combination of memory region information, in order to check, for each memory, whether an additional repair operation is to be performed on the failure-adjacent signal line. Also, the flag storage circuit 217 may store the flag FLAG for each memory bank (not illustrated), in order to check, for each memory hank, whether an additional repair operation is to be performed on the failure-adjacent signal line.

Figure 3:
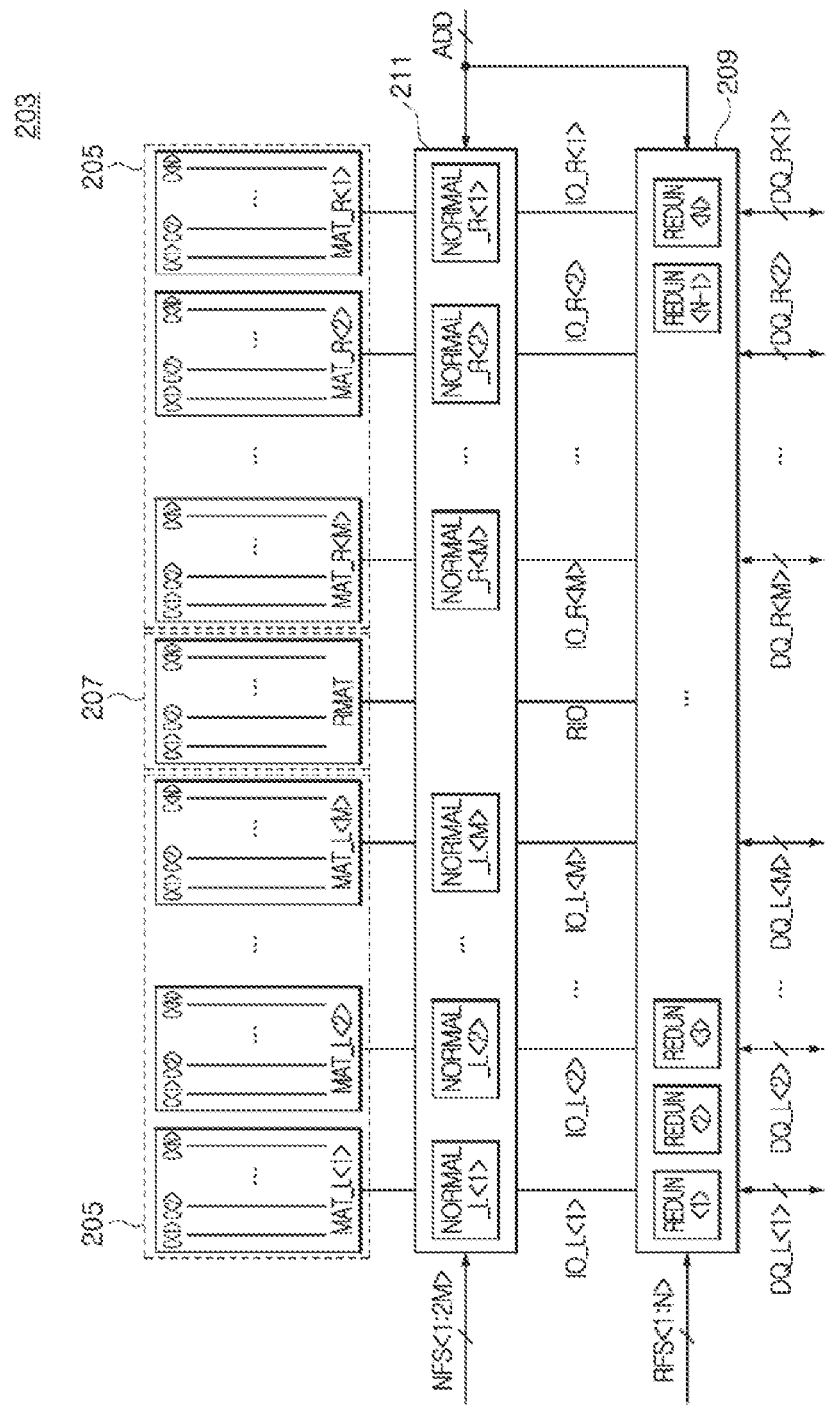
FIG. 3 is a block diagram illustrating a configuration of an embodiment of a data storage circuit illustrated in FIG. 2.

FIG. 3 is a block diagram illustrating an embodiment of the data storage circuit 203 illustrated in FIG. 2. As illustrated in FIG. 3, the data storage circuit 203 may include the memory region 205, the redundancy region 207, the first repair circuit 209 and the second repair circuit 211.

The memory region 205 may include the plurality of memories MAT_L<1:M> and MAT_R<1:M>. Each of the plurality of memories MAT_L<1:M> and MAT_R<1:M> may include the plurality of signal lines C<1:N>. The redundancy region 207 may include the redundancy memory RMAT. The redundancy memory RMAT_may include the plurality of signal lines C<1:N> (I.e., redundancy repair lines C<1:N> in the redundancy region 207). Each of the plurality of signal lines C<1:N> included in the plurality of memories MAT_L<1:M> and MAT_R<1:M> and the redundancy memory RMAT may correspond to a combination of the address ADD. For example, the first signal lines C<1> may correspond to a first combination of the address ADD. The second signal lines C<2> may correspond to a second combination of the address ADD.

The first repair circuit 209 may include the plurality of redundancy fuse circuits REDUN<1:N >. The plurality of redundancy fuse circuits REDUN<1:N> may correspond to respective combinations of address information. In the repair mode, the first repair circuit 209 may receive a plurality of redundancy repair information RFS<1:N> for the respective combinations of the address information, and may store the received redundancy repair information RFS<1:N> in the plurality of redundancy fuse circuits REDUN<1:N>, respectively. For example, the first repair circuit 209 may store the first redundancy repair information RFS<1> by electrically programming an e-fuse included in the first redundancy fuse circuit REDUN<1>. The first repair circuit 209 may store the second redundancy repair information RFS<2> by electrically programming an e-fuse included in the second redundancy fuse circuit REDUN<2>. When performing the column operation, the first repair circuit 209 may transmit and receive data DQ_L<1:M> and DQ R<1:M> through data input/output lines IO_L<1:M> and IO_R<1:M> and a redundancy input/output line RIO, based on the address ADD and the redundancy repair information RFS<1:N>. When the repair mode is not performed, the first repair circuit 209 may transmit and receive the data DQ_L<1:M> and DQ_R<1:M> through the data input/output lines IO_L21 1:M> and IO_R<1:M>, respectively. In the column operation, the first repair circuit 209 may perform a repair operation by transmitting and receiving the data DQ through the redundancy input/output line RIO based on the redundancy repair information RFS corresponding to a combination of the address ADD. For example, in a state in which memory region information corresponding to the first memory MAT_L<1> is stored in the first redundancy fuse circuit REDUN<1>, when receiving the address ADD having a combination corresponding to the first signal line C<1>, the first repair circuit 209 may repair the first signal line C<1> of the first memory MAT_L<1> with the first signal line C<1> of the redundancy memory RMAT. In a state in which memory region information corresponding to the first memory MAT_L<1> is stored in the second redundancy fuse circuit REDUN<2>, when receiving the address ADD having a combination corresponding to the second signal line C<2>, the first repair circuit 209 may repair the second signal line C<2> of the first memory MAT_L<1> with the second signal line C<2> of the redundancy memory RMAT.

The second repair circuit 211 may include a plurality of normal fuse circuits NORMAL L<1:M> and NORMAL R<1:M>. The plurality of normal fuse circuits NORMAL_L<1:M> and NORMAL_R<1:M> may correspond to respective combinations of memory region information. The second repair circuit 211 may receive a plurality of normal repair information NFS<1:N> for the respective combinations of the memory region information, and may store the received normal repair information NFS<1:N> in the plurality of normal fuse circuits NORMAL_L<1:M> and NORMAL_R<1:M>, respectively. For example, the second repair circuit 211 may store the first normal repair information NFS<1> by electrically programming an e-fuse included in the first normal fuse circuit NORMAL_L<1>. The second repair circuit 211 may store the second normal repair information NFS<2> by electrically programming an e-fuse included in the second normal fuse circuit NORMAL_L<2>. The second repair circuit 211 may transmit and receive each of the data DQ_L<1:M> and DQ_R<1:M> through one of the plurality of signal lines C<1:N> selected depending on a combination of the address ADD. When, in the column operation, a combination of the address ADD is the same as address information on a faded signal line based on the plurality of normal repair information NFS<1:N>, the second repair circuit 211 may repair the failed signal line by converting the combination of the address ADD into address information on a normal repair line. For example, in the repair mode, the second repair circuit 211 may store, in the first normal fuse circuit NORMAL_L<1>, address information on the first signal line C<1> set as a failed signal line and the third signal line C<3> set as a normal repair line. Thereafter, when receiving, in the column operation, the address ADD having a combination corresponding to the first signal line C<1>, the second repair circuit 211 may repair the failed signal line by converting the combination of the addresses ADD into address information on the third signal line C<3>.

Figure 4:
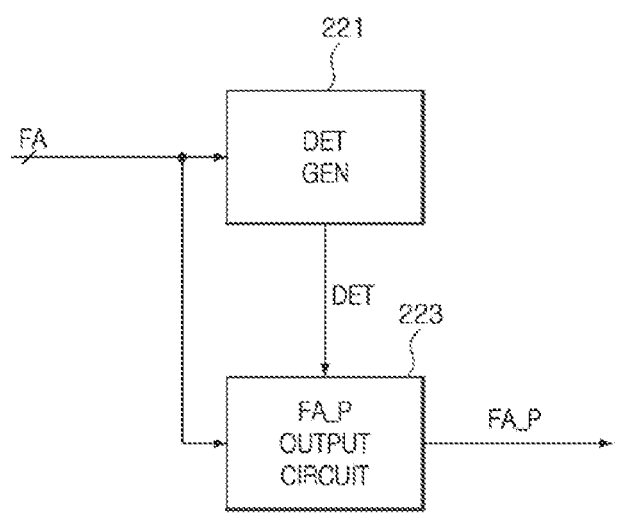
FIG. 4 is a block diagram illustrating a configuration of an embodiment of a potential failure information generation circuit illustrated in FIG. 2.

FIG. 4 is a block diagram illustrating a configuration of an embodiment of the potential failure information generation circuit 213 illustrated in FIG. 2. As illustrated in FIG. 4, the potential failure information generation circuit 213 may include a detection signal generation circuit (DET GEN) 221 and a potential failure information output circuit (FA_P OUTPUT CIRCUIT) 223.

In the repair mode, the detection signal generation circuit 221 may generate a detection signal DET by detecting whether failed signal lines are adjacent to each other, based on failure information FA. The detection signal generation circuit 221 may generate the detection signal DET by detecting whether a first failed signal line and a second failed signal line are adjacent to each other, based on first failure information FA<1> and second failure information FA<2>. For example, when the first and second failed signal lines are set as the first and second signal lines C<1> and C<2>, respectively, included in the first memory MAT_L<1>, the detection signal DET may be activated. The number of adjacent failed signal lines for the detection signal DET to be activated in the detection signal generation circuit 221 may be variously set depending on an embodiment.

The potential failure information output circuit 223 may generate the potential failure information FA_P from the failure information FA when the detection signal DET is activated in the repair mode. For example, when the detection signal DET is activated, the potential failure information output circuit 223 may generate the potential failure information FA_P on a failure-adjacent signal line from the first failure information FA<1> and the second failure information FA<2>. For example, the potential failure information output circuit 223 may generate the potential failure information FA _P on the third signal line C<3> included in the first memory MAT_L<1> from the first failure information FA<1> on the first signal line C<1> included in the first memory MAT_L<1> and the second failure information FA<2> on the second signal line C<2> included in the first memory MAT_L<1>.

Figure 5:
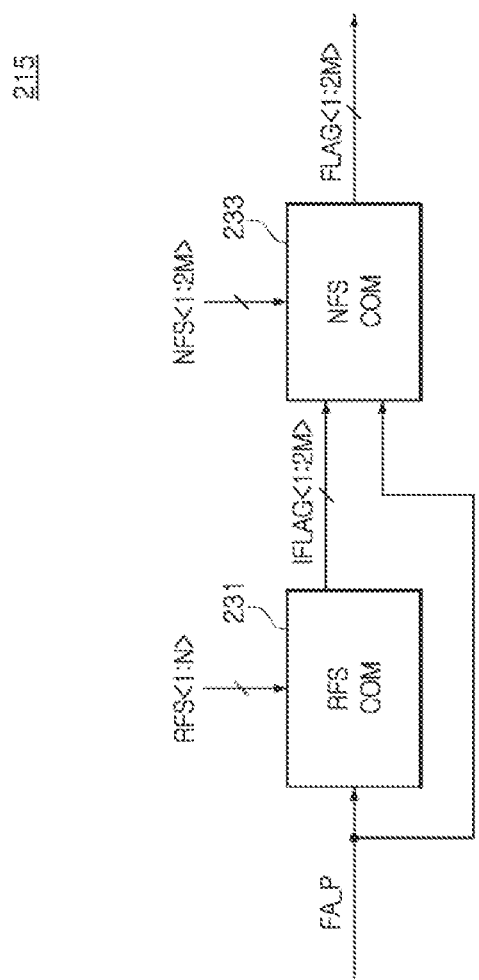
FIG. 5 is a block diagram illustrating a configuration of an embodiment of a flag generation circuit illustrated in FIG. 2.

FIG. 5 is a block diagram illustrating a configuration of an embodiment of the flag generation circuit 215 illustrated in FIG. 2. As illustrated in FIG. 5, the flag generation circuit 215 may include a first repair information comparison circuit (RFS COM) 231 and a second repair information comparison circuit (NFS COM) 233.

The first repair information comparison circuit 231 may generate internal flags IFLAG<1:2M> by comparing the potential failure information FA_P with the redundancy repair information RFS<1:N>. The first repair information comparison circuit 231 may generate the internal flags IFLAG<1:2M> for respective combinations of memory region information on failure-adjacent signal lines. When memory region information is stored in the redundancy repair information RFS<1:N> corresponding to address information on failure-adjacent signal lines, the first repair information comparison circuit 231 may activate the internal flags IFLAG<1:2M>. For example, when a failure-adjacent signal line is set as the first signal line C<1> (see FIG. 3) of the first memory MAT_L<1> (see FIG. 3), the first repair information comparison circuit 231 may generate the first internal flag IFLAG<1> corresponding to the first memory MAT_L<1> (see FIG. 3). When a failure-adjacent signal line is set as the first signal line C<1> of the first memory MAT_L<1> and memory region information is stored in the first redundancy fuse circuit REDUN<1> (see FIG. 3), the first repair information comparison circuit 231 may activate the first internal flag IFLAG<1>.

The second repair information comparison circuit 233 may generate respective flags FLAG<1:2M> by comparing the potential failure information FA_P with the normal repair information NFS<1:2M> based on the internal flags IFLAG<1:2M>. The second repair information comparison circuit 233 may activate each of the flags FLAG<1:2M>, when, based on the potential failure information FA_P and the normal repair information NFS, memory region information on a failure-adjacent signal line and memory region information on a normal repair line are different from each other and address information on the failure-adjacent signal line and address information on the normal repair line are the same as each other, The second repair information comparison circuit 233 may activate the flags FLAG<1:2M> when the internal flags IFLAG<1:2M> are activated, respectively. For example, the second repair information comparison circuit 233 may activate the first flag FLAG 1> when the first internal flag IFLAG<1> is activated. The second repair information comparison circuit 233 may activate the second flag FLAG<2> when the second internal flag FLAG 2> is activated.

Figure 6:
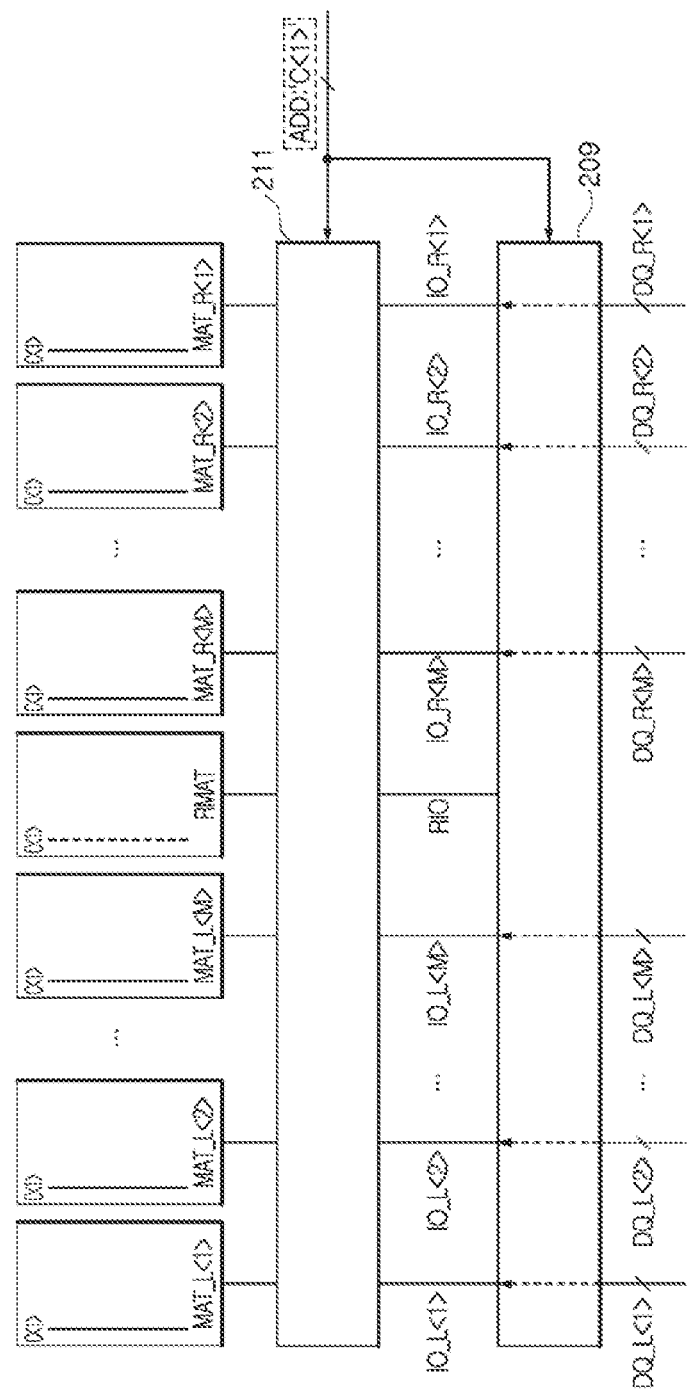
FIGS. 6, 7 and 8 are diagrams to assist in the explanation of operations in which data are input in the data storage circuit illustrated in FIG. 3.

FIG. 6 is a diagram to assist in the explanation of an operation in which the data DQ is input in the data storage circuit 203 illustrated in FIG. 3 when the repair mode is not performed.

Referring to FIG. 6, when the repair mode is not performed, the first repair circuit 209 may transmit the data DQ_L<1:M> and DQ_R<1:M> to the data input/output lines IO_L<1:M> and IO_R<1:M>, respectively, When a combination of the address ADD corresponds to the first signal line C<1> in a write operation, the second repair circuit 211 may transmit the data DQ_L 1:M> and DQ_R<1:M> loaded on the data input/output lines IO_L<1:M and IO_R<1:M>, to the first signal lines C<1>, respectively, included in the plurality of memories MAT_L<1:M> and MAT_R<1:M >.

Figure 7:
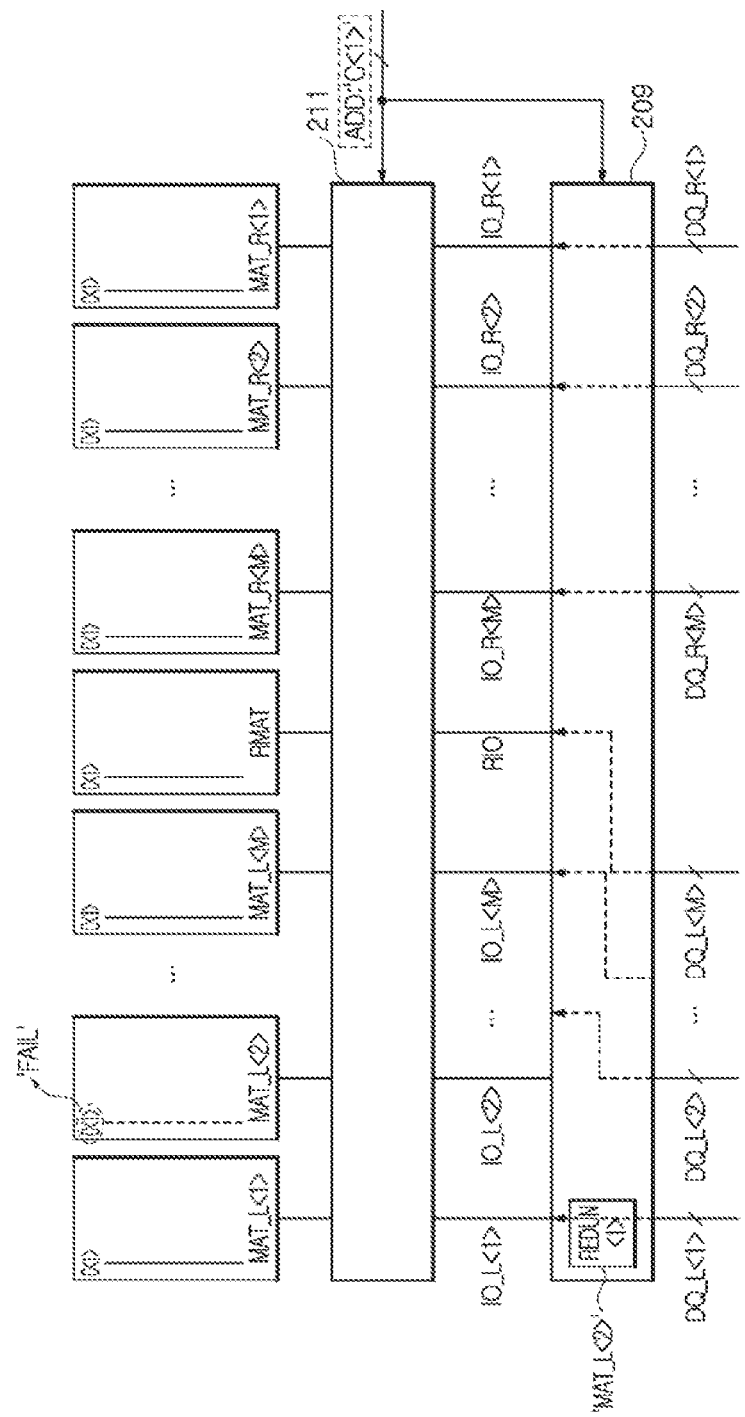

FIG. 7 is a diagram to assist in the explanation of an operation in which the data DQ is input in the data storage circuit 203 illustrated in FIG. 3 when a repair operation on a failed signal line is performed.

Referring to FIG. 7, the first signal line C<1> of the second memory MAT_L<2> is in a state in which a failure 'FAIL' is detected in the test mode. The first repair circuit 209 is in a state in which memory region information on the second memory MAT_L<2> is stored in the first redundancy fuse circuit REDUN<1>.

When the address ADD having a combination corresponding to the first signal line C<1> is input, the first repair circuit 209 may repair the first signal line C<1> of the second memory MAT_L<2> with the first signal line C<1> of the redundancy memory RMAT. The first repair circuit 209 may repair the first signal line C<1> of the second memory MAT_L<2> with the first signal line C<1> of the redundancy memory RMAT, by transmitting the data DQ_L<2:M-1> to the data input/output lines IO_L<3:M> respectively, and transmitting the data DQ_L<M> to the redundancy to input/output line RIO.

Figure 8:
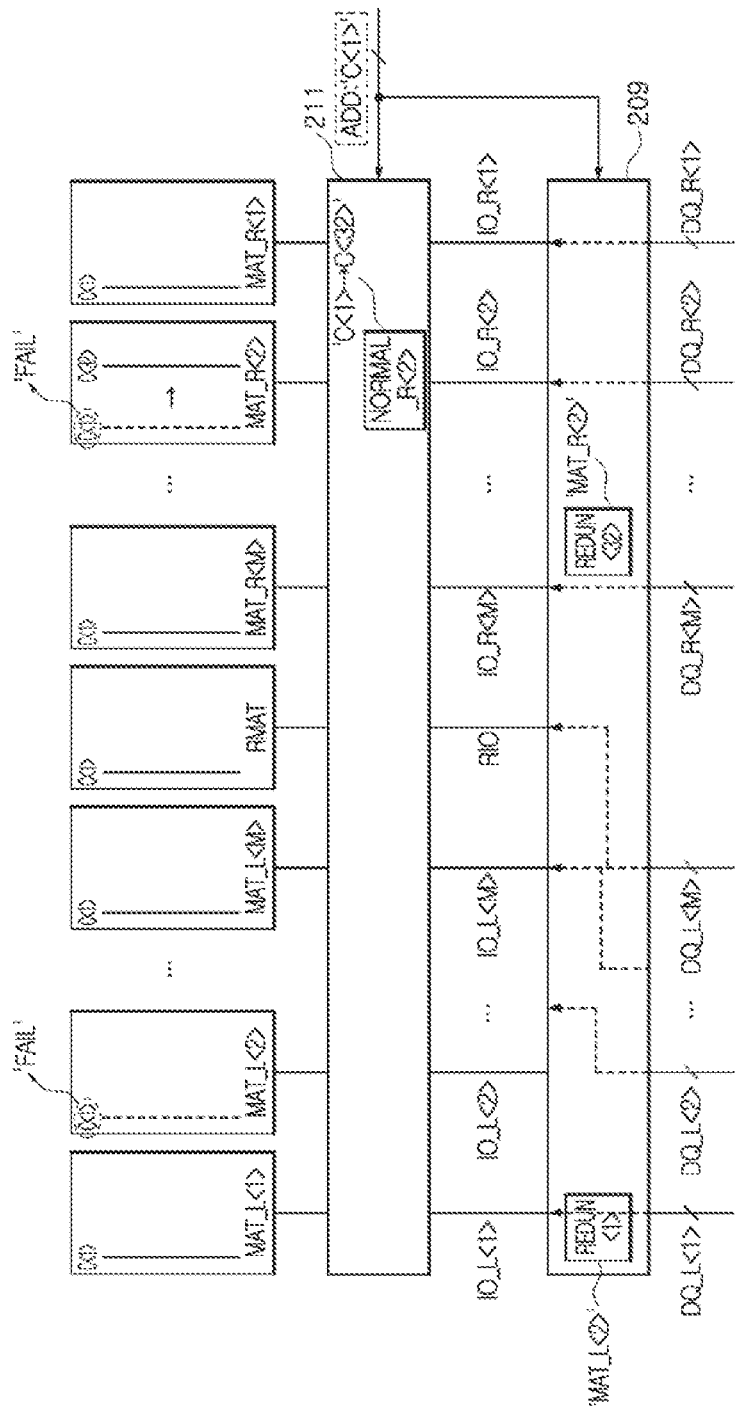

FIG. 8 is a diagram to assist in the explanation of an operation in which the data DQ is input in the data storage circuit 203 illustrated in FIG. 3 when a repair operation on a plurality of failed signal lines having the same address information is performed.

Referring to FIG. 8, each of the first signal line C<1> of the second memory MAT_L<2> and the first signal line C<1> of the (M+32)^th memory MAT_R<2> is in a state in which a failure 'FAIL' is detected in the test mode. The first repair circuit 209 is in a state in which memory region information on the second memory MAT_L<2> is stored in the first redundancy fuse circuit REDUN<1>. The second repair circuit 211 is in a state in which address information for repairing the first signal line C<1> with the thirty-second signal line C<32> is stored in the (M+2)^th normal fuse circuit NORMAL_R<2>. Accordingly, the first repair circuit 209 is in a state in which, in order to repair the thirty-second signal line C<32> of the (M+2)^th memory MAT_R<2> in the redundancy memory RMAT, memory region information on the (M+2)^th memory MAT_R<2> is stored in the thirty-second redundancy fuse circuit REDUN<32>.

An operation in which the first repair circuit 209 repairs the first signal line C<1> of the second memory MAT_L<2> with the first signal line C<1> of the redundancy memory RMAT is implemented in the same manner as the operation of FIG. 7.

When the address ADD having a combination corresponding to the first signal line C<1> is input, the second repair circuit 211 may repair the first signal line C<1> of the (M+2)^th memory MAT_R<2> with the thirty-second signal line C<32> of the (M+2)^th memory MAT_R<2>.

Below are examples illustrating operations of the potential failure information generation circuit 213 (see FIG. 2), the flag generation circuit 215 (see FIG. 2) and the flag storage circuit 217 (see FIG. 2) in the case of FIG. 8, depending on memory region information and address information on failure-adjacent signal line.

For example, if a failure-adjacent signal line in the first memory MAT_L<1> is set as the first signal line C<1>, the potential failure information generation circuit 213 may generate the potential failure information FA_P (see FIG. 2) on the first signal line C<1> in the first memory MAT_L<1>. The flag generation circuit 215 may activate the first flag FLAG<1> (see FIG. 5) by checking that memory region information is stored in the first redundancy fuse circuit REDUN<1> corresponding to the address information on the failure-adjacent signal line, based on the potential failure information FA _P and the redundancy repair information RFS (see FIG. 2). The flag storage circuit 217 (see FIG. 2) stores the first flag FLAG<1> to indicate that there is no repair line for the failure-adjacent signal line in the first memory MAT_L<1>.

For another example, if a failure-adjacent signal line in the second memory MAT_L<2> is set as the thirty-second signal line C<32>, the potential failure information generation circuit 213 may generate the potential failure information FA_P (see FIG. 2) on the thirty-second signal line C<32> in the second memory MAT_L<2>. The flag generation circuit 215 may activate the second flag FLAG<2> (see FIG. 5) by checking that memory region information is stored in the thirty-second redundancy fuse circuit REDUN<32> corresponding to the address information on the failure-adjacent signal line, based on the potential failure information FA_P and the redundancy repair information RFS (see FIG. 2). Also, the flag generation circuit 215 may activate the second flag FLAG<2> by comparing the address information on the failure-adjacent signal line with address information on normal repair line stored in the (M+2)^th normal fuse circuit NORMAL based on the potential failure information FA_P and the normal repair information NFS (see FIG. 2). The flag storage circuit 217 (see FIG. 2) stores the second flag FLAG<2> to indicate that there is no repair line for the failure-adjacent signal line in the second memory MAT_L<2>.

As is apparent from the above description, in the disclosure, by checking, in a repair mode, whether there is a repair line for a failure-adjacent signal line neighboring faded signal lines adjacent to each other, it is possible to determine whether an additional repair operation is to be performed on the failure-adjacent signal line having possibility for a failure to occur.

Figure 9:
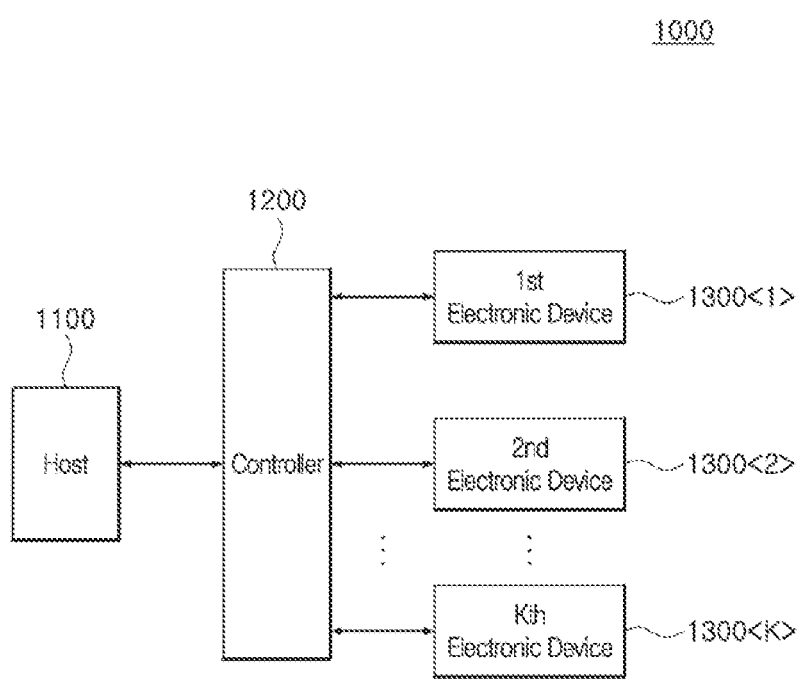
FIG. 9 is a block diagram illustrating a configuration of another embodiment of the system illustrated in FIG. 1.

FIG. 9 is a block diagram illustrating a configuration of another embodiment of the system 100 illustrated in FIG. 1. As illustrated in FIG. 9, a system 1000 may include a host 1100, a controller 1200 and electronic devices 1300<1:K>. The controller 1200 may be implemented by the controller 110 illustrated in FIG. 1. Each of the electronic devices 1300<1:K> may be implemented by the apparatus 120 illustrated in FIG. 1. In an embodiment, 'K' may be a natural number.

The host 1100 and the controller 1200 may transmit signals to each other by using an interface protocol. Examples of the interface protocol used between the host 1100 and the controller 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus).

The controller 1200 may control the electronic devices 1300<1:K> so that each of the electronic devices 1300<1:K> performs various internal operations including a repair mode, a test mode and a column operation.

According to an embodiment, the electronic devices 1300<1:K> may be implemented by a DRAM (dynamic random access memory), a PRAM (phase change random access memory), an RRAM (resistive random access memory), an MRAM (magnetic random access memory) and an FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An apparatus comprising:
a potential failure information generation circuit configured to generate potential failure information by detecting, based on first failure information on a first failed signal line and second failure information on a second failed signal line, whether the first failed signal line and the second failed signal line are adjacent to each other; and
a flag generation circuit configured to generate a flag by comparing the potential failure information with redundancy repair information or with normal repair information for repairing a failed signal line in a memory region, and
wherein, the potential failure information generation circuit configured to generate the potential failure information which is enabled when address information of the first failure signal line and the address information of the second failure signal line have successive combinations.

2. The apparatus according to claim 1, wherein the potential failure information generation circuit receives the first and second failure information in a repair mode, the first failure information includes memory region information and the address information on the first failed signal line, and the second failure information includes the memory region information and the address information on the second failed signal line.

3. The apparatus according to claim 2, wherein the potential failure information generation circuit generates the potential failure information when, based on the first and second failure information, the memory region information on the first failed signal line and the memory region information on the second failed signal line are the same as each other and the address information on the first failed signal line and the address information on the second failed signal line have successive combinations.

4. The apparatus according to claim 2, wherein the potential failure information generation circuit generates the potential failure information based on the first and second failure information, and the potential failure information includes memory region information and address information on a failure-adjacent signal line.

5. The apparatus according to claim 4, wherein the potential failure information generation circuit generates the potential failure information based on the first and second failure information, the memory region information on the failure-adjacent signal line is the same as the memory region information on the first and second failed signal lines, and the address information on the failure-adjacent signal line has a combination successive to the address information on the first and second failed signal lines.

6. The apparatus according to claim 1, wherein the flag generation circuit generates the flag by comparing the potential failure information on the failure-adjacent signal line with the redundancy repair information, and the redundancy repair information includes memory region information and address information on a third failed signal line.

7. The apparatus according to claim 6, further comprising:
a first repair circuit configured to repair, when an address on the third failed signal line is input in a column operation, the third failed signal line with a redundancy repair line based on the redundancy repair information, the address information on the third failed signal line and the address information on the redundancy repair line being set to be the same as each other.

8. The apparatus according to claim 6, wherein the flag generation circuit activates the flag when, based on the potential failure information and the redundancy repair information, the memory region information on the failure-adjacent signal line is different from the memory region information on the third failed signal line and the address information on the failure-adjacent signal line is the same as the address information on the third failed signal line.

9. The apparatus according to claim 1, wherein the flag generation circuit generates the flag by comparing the potential failure information on the failure-adjacent signal line with the normal repair information, and the normal repair information includes the memory region information and address information on a fourth failed signal line and a normal repair line.

10. The apparatus according to claim 9, further comprising:
a second repair circuit configured to repair, when an address on the fourth failed signal line is input in a column operation, the fourth failed signal line with the normal repair line based on the normal repair information, the memory region information on the fourth failed signal line and the memory region information on the normal repair line being set to be the same as each other.

11. The apparatus according to claim 10, wherein, when a combination of the address is the same as the address information on the fourth failed signal line in the column operation, the second repair circuit converts the combination of the address into the address information on the normal repair line.

12. The apparatus according to claim 9, wherein the flag generation circuit activates the flag when, based on the potential failure information and the normal repair information, the memory region information on the failure-adjacent signal line is different from the memory region information on the normal repair line and the address information on the failure-adjacent signal line is the same as the address information on the normal repair line.

13. An apparatus comprising:
a repair control circuit configured to generate, based on first failure information on a first failed signal line, redundancy repair information for repairing the first failed signal line in a redundancy region; and
a flag generation circuit configured to generate a flag by comparing potential failure information enabled when address information of third failure signal line and the address information of fourth failure signal line have successive combinations with the redundancy repair information or configured to generate a flag by comparing the potential failure information with normal repair information for repairing a failed signal line in a memory region.

14. The apparatus according to claim 13, wherein the flag generation circuit activates the flag when, based on the potential failure information and the redundancy repair information, address information on the failure-adjacent signal line is the same as address information on the first failed signal line.

15. The apparatus according to claim 13, wherein, when second failure information on a second failed signal line is input and address information on the second failed signal line is the same as the address information on the first failed signal line, the repair control circuit generates the normal repair information for repairing the second failed signal line with a normal repair line in the memory region.

16. The apparatus according to claim 15, wherein the flag generation circuit activates the flag when, based on the potential failure information and the normal repair information, the address information on the failure-adjacent signal line is the same as the address information on the normal repair line.

17. The apparatus according to claim 15, wherein, when the second failure information is input and address information on the second failed signal line is the same as the address information on the first failed signal line, the repair control circuit generates the redundancy repair information for repairing the normal repair line in the redundancy region.

18. The apparatus according to claim 15, wherein, when the second failure information is input and address information on the second failed signal line is different from the address information on the first failed signal line, the repair control circuit generates the redundancy repair information for repairing the second failed signal line in the redundancy region.

19. The apparatus according to claim 13, further comprising:
a potential failure information generation circuit configured to generate the potential failure information by detecting, based on third failure information on the third failed signal line and fourth failure information on the fourth failed signal line, whether the third failed signal line and the fourth failed signal line are adjacent to each other.

20. The apparatus according to claim 19, wherein the potential failure information generation circuit generates the potential failure information based on the third failure information and the fourth failure information, and address information of the potential failure information has a combination successive to the address information of the third and fourth failure information.

* * * * *